(12) United States Patent
Hussey et al.

(10) Patent No.: US 9,246,318 B2
(45) Date of Patent: Jan. 26, 2016

(54) ADJUSTABLE WIREWAY ASSEMBLY, METHOD OF EMPLOYING, AND ENCLOSURE EMPLOYING THE SAME

(71) Applicant: EATON CORPORATION, Cleveland, OH (US)

(72) Inventors: Matthew Ryan Hussey, Chicago, IL (US); Jeffrey Scott Kuykendall, Spartanburg, SC (US); James Darryl Robinson, Greenwood, SC (US); Mitchell Dean Fretwell, Greenwood, SC (US); Michael Howard Abrahamsen, Greenwood, SC (US); Daniel Garett Sims, Newberry, SC (US); Michael Davis Pearce, Plum Branch, SC (US)

(73) Assignee: EATON CORPORATION, Cleveland, OH (US)

( * ) Notice: Subject to any disclaimer, the term of this patent is extended or adjusted under 35 U.S.C. 154(b) by 142 days.

(21) Appl. No.: 14/193,596

(22) Filed: Feb. 28, 2014

(65) Prior Publication Data

US 2015/0249328 A1    Sep. 3, 2015

(51) Int. Cl.
H02G 3/22 (2006.01)
H05K 5/02 (2006.01)
H02G 1/00 (2006.01)

(52) U.S. Cl.
CPC . *H02G 3/22* (2013.01); *H02G 1/00* (2013.01); *H05K 5/0247* (2013.01)

(58) Field of Classification Search
USPC .................... 174/50, 50.51, 50.55
See application file for complete search history.

(56) References Cited

U.S. PATENT DOCUMENTS

| | | | |
|---|---|---|---|
| 7,476,804 B2 * | 1/2009 | Adducci | H02B 1/202 174/50 |
| 7,659,476 B2 * | 2/2010 | Hruby | H04Q 1/02 174/17 R |
| 7,687,716 B2 * | 3/2010 | Pepe | H04Q 1/142 174/101 |

* cited by examiner

*Primary Examiner* — Dhirubhai R Patel
(74) *Attorney, Agent, or Firm* — Eckert Seamans Cherin & Mellott, LLC; Stephen A. Bucchianeri; Philip E. Levy

(57) ABSTRACT

An adjustable wireway assembly for use in an electrical enclosure includes a panel structured to form a portion of the electrical enclosure, the panel having a first aperture defined therein. The assembly further includes a plate member selectively coupled to the panel about a portion of the first aperture in at least one of a first position and a second position in a manner that blocks at least a portion of the first aperture and thereby defines a second aperture formed from a portion of the first aperture. When coupled in the first position, the second aperture is of a first area and when coupled in the second position, the second aperture is of a second area different than the first area.

20 Claims, 8 Drawing Sheets

ADJUSTABLE WIREWAY ASSEMBLY, METHOD OF EMPLOYING, AND ENCLOSURE EMPLOYING THE SAME

BACKGROUND

1. Field

The disclosed concept relates generally to enclosures and, more particularly, to adjustable wireway assemblies for electrical enclosures. The disclosed concept also relates to electrical enclosures employing adjustable wireway assemblies as well as a method for employing an adjustable wireway assembly.

2. Background Information

Electrical equipment such as, for example, relays, circuit breakers, electric meters and transformers, are typically housed within an enclosure such as, for example, a housing, such as a box or cabinet. Such enclosure generally serves a dual purpose, to protect the electrical equipment housed therein from environmental conditions and to protect the surrounding environment (and persons thereby) from potential hazards related to the electrical equipment disposed therein. Such hazards may commonly include the risk of electrical shock and risks posed by the production of gas and debris during an arc fault event.

Current design for low voltage wiring arc resistant switchgear requires a correctly sized conduit fitting to be used as a wireway for running low voltage wires between compartments or to/from the cabinet, in order to reduce/eliminate the transmission of gas and debris produced during an arc fault event from exiting an enclosure and/or moving between compartments within an enclosure. In addition to such specifically sized conduit fittings, caulking with RTV (room temperature vulcanizing) silicone is used to seal up any additional open space around wires to provide a seal necessary for achieving an arc resistant type "2B" rating for arc resistant switchgear (IEEE C37.20.7 Specification). While desired design performance may be generally achieved through such arrangement, the practice is generally inflexible to adding any additional wires for internal or external customer use.

Accordingly, there is room for improvement in electrical enclosures, and in wireway assemblies therefor.

SUMMARY

These needs and others are met by embodiments of the disclosed concept, which provide adjustable wireway assemblies for electrical enclosures that allow for harnesses and single wires to be passed there-through and the wireway then to be tightly closed around the harness/wires. With the use of an additional wrap on gasketing material a suitable seal is formed which limits the possibility of gas/burning debris from passing through the wireway assembly. Embodiments of the disclosed concept eliminate the need for multiple discreet fitting sizes, allows for ease of customer access for additional wires after harnesses have been run, and also provides a seal equal to or exceeding that of the conventional designs.

As one aspect of the disclosed concept, an adjustable wireway assembly for an electrical enclosure is provided. The wireway assembly comprises: a panel structured to form a portion of an electrical enclosure, the panel having a first aperture defined therein; and a plate member selectively coupled to the panel about a portion of the first aperture in at least one of a first position and a second position in a manner that blocks at least a portion of the first aperture and thereby defines a second aperture formed from a portion of the first aperture. When coupled in the first position the second aperture is of a first area and when coupled in the second position the second aperture is of a second area different than the first area.

The plate member may include a number of apertures formed therein; and when the plate member is disposed in either of the first or second positions the plate member may be coupled to the panel via a number of threaded fasteners, each protruding through a respective one of the apertures.

Each aperture of the number of apertures formed in the plate member may be formed as a slot and the plate member may be slidable among a number of positions between the first position and the second position.

The plate member may be selectively coupled to the panel in any of the number of positions between the first position and the second position.

The plate member may be a first plate member and the wireway assembly may comprise a second plate member selectively coupled to the panel about another portion of the first aperture on a side opposite the first plate member. The second plate member being selectively coupled to the panel so as to be moveable generally toward or way from the first plate member in at least one of a first position and a second position in a manner that blocks another portion of the first aperture and thereby, along with the first plate member, defines a third aperture formed from a portion of the first aperture. When the second plate member is coupled in the first position the third aperture is of a first area and when coupled in the second position the third aperture is of a second area different than the first area.

The second plate member may include a number of apertures formed therein and when the second plate member is disposed in either of the first or second positions the second plate member is coupled to the panel via a number of threaded fasteners, each protruding through a respective one of the apertures.

Each aperture of the number of apertures formed in the second plate member may be formed as a slot and second plate member may be slidable among a number of positions between the first position and the second position.

The second plate member may be selectively coupled to the panel in any of the number of positions between the first position and the second position.

As another aspect of the disclosed concept, an electrical enclosure comprises: a housing formed from a number of panels and an adjustable wireway assembly such as previously described.

As yet another aspect of the disclosed concept, a method of assembling a sealed wireway assembly in an electrical enclosure comprises: passing a number of wires through an aperture formed in a panel of the electrical enclosure; generally centering a gasket material disposed about the number of wires in the aperture; and adjusting the position, with respect to the panel, of a first plate member disposed about the aperture such that a snug fit is produced between at least a portion of the first plate member and the gasket material and between at least a portion of the aperture and the gasket material.

Adjusting the position, with respect to the panel, of the first plate member may comprise sliding the first plate member with respect to the panel and coupling the first plate member to the panel.

The method may further comprise adjusting the position, with respect to the panel, of a second plate member disposed about the aperture such that a snug fit is produced between at least a portion of the second plate member and the gasket material and between at least a portion of the first plate member and the gasket material.

Adjusting the position, with respect to the panel, of the second plate member may comprise sliding the second plate member with respect to the panel and coupling the second plate member to the panel.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

For purposes of illustration, embodiments of the disclosed concept will be described as applied to electrical enclosures for housing switchgear related electrical equipment (e.g., without limitation, relays; circuit breakers; electric meters; transformers), although it will become apparent that embodiments of the disclosed concept could also be applied to other types of electrical enclosures for indoor or outdoor use.

As employed herein, the term "fastener" refers to any suitable fastening, connecting or tightening mechanism expressly including, but not limited to, screws, rivets, bolts and the combinations of bolts and nuts (e.g., without limitation, lock nuts), threaded studs and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the statement that two or more parts are "selectively coupled" shall mean that the parts are joined together either directly or joined through one or more intermediate parts in a non-permanent manner (e.g., via threaded fasteners) such that coupling may be selectively undone or redone in a non-destructive manner.

As employed herein, the term "number" means one or an integer greater than one (i.e., a plurality).

Figure 1:
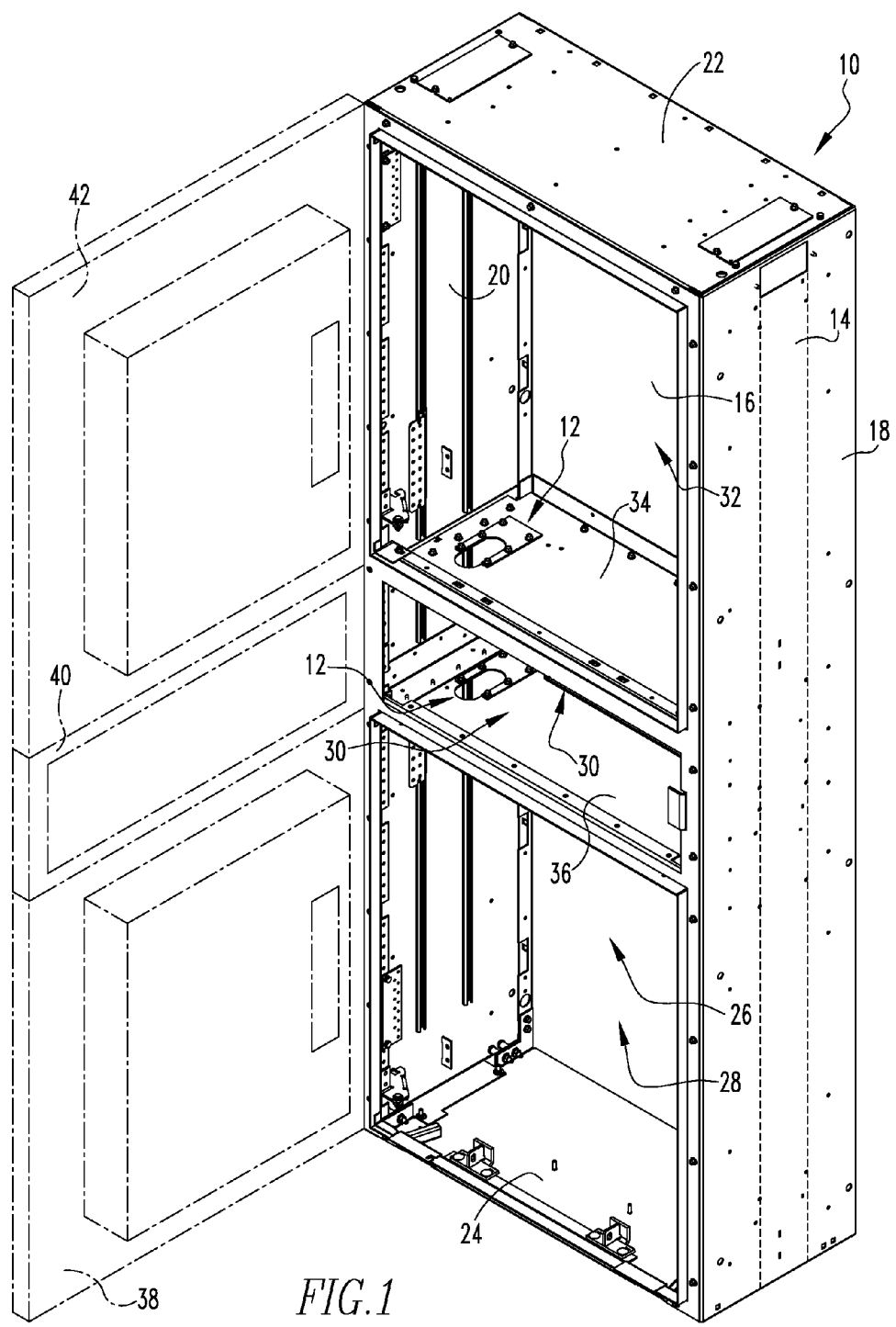
FIG. 1 is an isometric view of an electrical enclosure including wireway assemblies in accordance with an embodiment of the disclosed concept.

FIG. 1 shows an example electrical enclosure 10 employing two wire conduit assemblies (shown generally at 12) in accordance with an embodiment of the disclosed concept. The example electrical enclosure 10 illustrated functions as the front portion of a switchgear cabinet (e.g., one or more breakers would be mounted in cabinetry rearward of enclosure 10). The electrical enclosure 10 includes a housing 14 having a back portion 16 that may be sealed with a panel member or alternately that may be sealed against a portion of another enclosure (not shown, e.g., a rear cabinet portion of a switchgear arrangement); two side panels in the form of a right hand sheet 18 and a left hand sheet 20; along with top and bottom panels 22, 24 extending forwardly from the back portion 16 to define an interior 26 generally segregated into multiple internal compartments 28, 30, 32 via internal panels 34, 36. Housing 14 further includes front panels or doors 38, 40, 42 (shown schematically) which are selectively moveable (e.g., without limitation, via hinges) in order to provide access to the interior 26 of the electrical enclosure 10. As typically utilized, each of the internal compartments 28, 30, 32 may be utilized to house electrical components (e.g., without limitation, pilot lights, selector switches, communications devices, control/logic components (i.e., control circuit devices responsible for operation of medium voltage breakers), status indication meters, lights, and sensing devices (relays) for protection of downstream loads as well as interconnected equipment buswork) generally dedicated to particular circuits or to other components related thereto.

Figure 2:
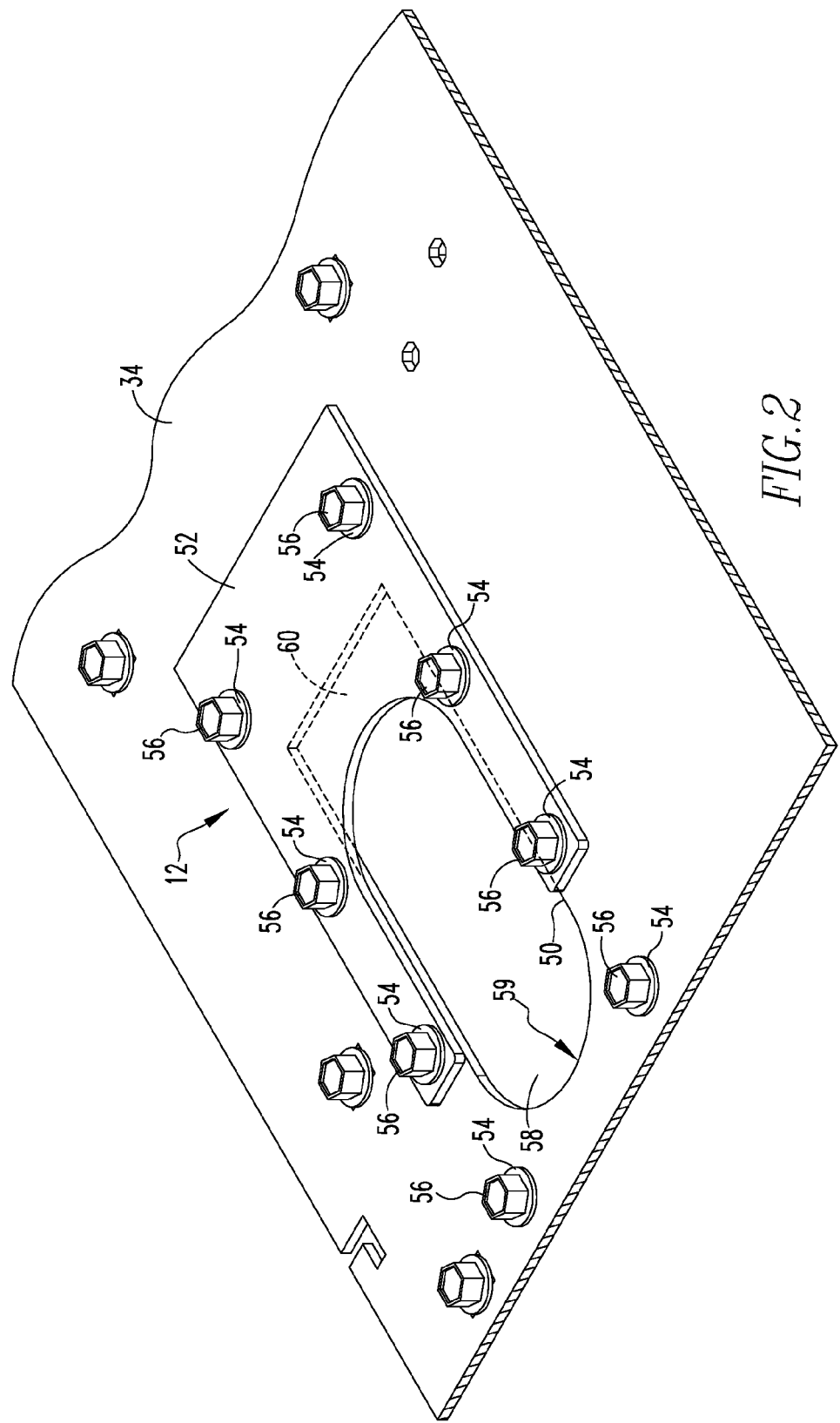
FIGS. 2 and 3 are isometric views of a portion of an electrical enclosure including a wireway assembly in accordance with an example embodiment of the disclosed concept disposed, respectively, in a first position and a second position with respect to the portion of the electrical enclosure.
Figure 3:
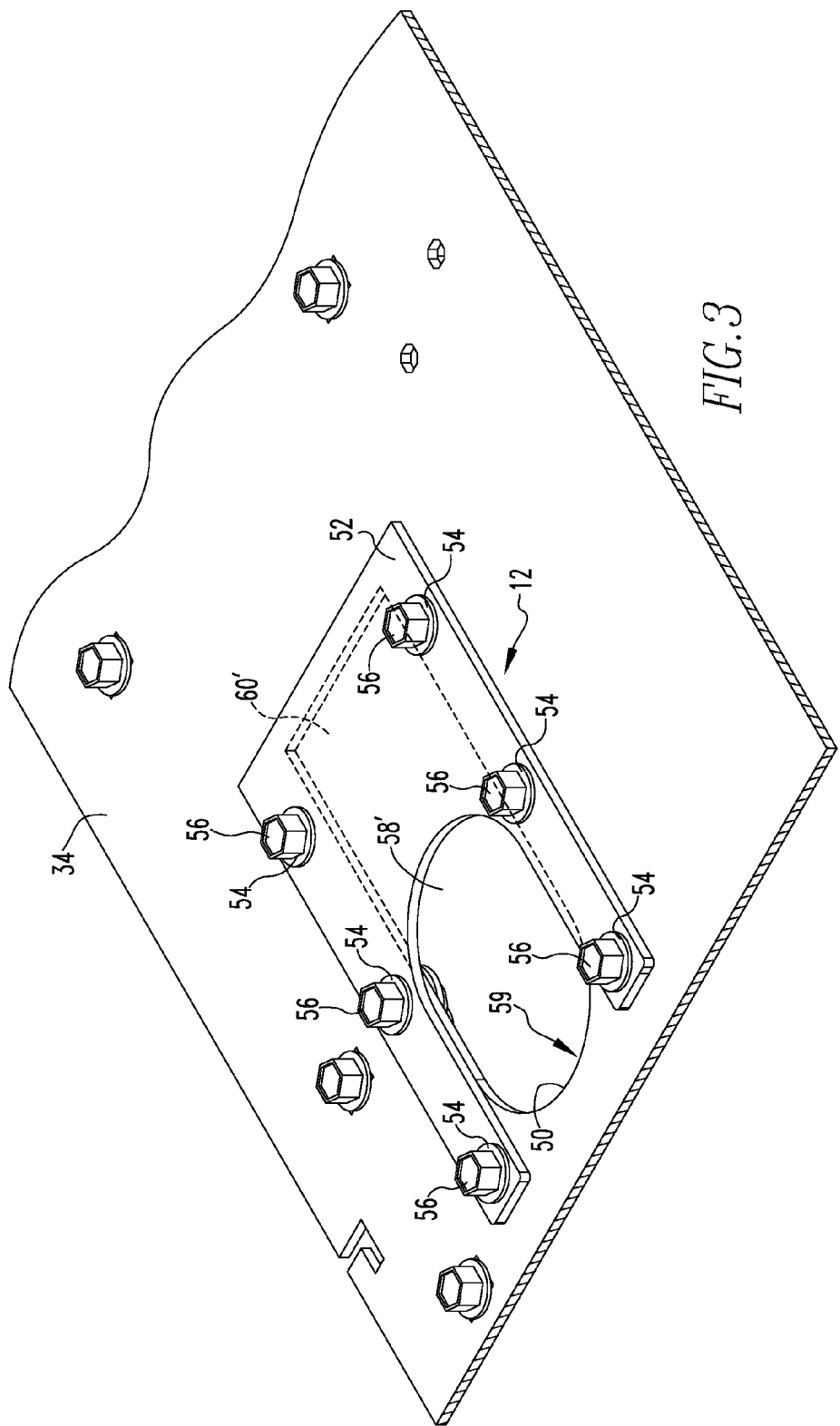

FIGS. 2 and 3 illustrate detailed views of the portion of the enclosure 10 of FIG. 1 which includes one of the wireway assemblies 12 in accordance with an example embodiment of the disclosed concept. Like conventional conduit passages, each wireway assembly 12 is adapted to allow a number of wires (not shown) to be passed therethrough such that the wires may provide electrical connections between various electrical components housed within the enclosure 10 and/or to elements disposed outside of the enclosure 10. However, unlike conventional wireway assemblies such as those previously discussed in the Background Information which are of particular fixed size, the sizing of wireway assembly 12 may be adjusted to accommodate the particular quantity of wires needed to pass therethrough and/or can allow for the passage of prewired terminals or wire blocks of larger size than the sealed passage.

In order to provide such improved functionality over conventional wireway passages, wireway assembly 12 includes an aperture 50 (a portion of which is shown in hidden line in FIGS. 2 and 3) formed in a panel of the enclosure, such as, for example, without limitation, internal panel 34, which allows for wires and/or other electrical connection members (e.g., without limitation, cables, communications wires, wire bundles, etc.) to pass therethrough. As compared to conventional wireway assemblies, aperture 50 is generally of a larger size. It is to be appreciated that the particular placement, shape and size of aperture 50 illustrated and described herein are done for exemplary purposes only and are not intended to be limiting upon the disclosed concept but instead embodiments may be readily applied to other locations other than those particularly described herein without varying from the scope of the disclosed concept. As shown in the embodiment of FIGS. 2 and 3, a curved portion (shown generally at 59) may be provided in aperture 50 in order to accommodate the typically rounded form a bundle of wires takes on when grouped together.

Continuing to refer to FIG. 2, wireway assembly 12 further includes an adjustable member, such as plate member 52 selectively coupled to panel 34 about a portion of aperture 50 via a suitable number of fasteners. In the example embodiment illustrated in FIG. 2, such coupling is accomplished via the interaction of circular apertures (not numbered) provided in plate member 52; bolts 56 which pass through washers 54 and through apertures provided in plate member 52 and threadingly engage a threaded member (e.g., without limitation, nuts, threaded apertures) provided in or on the opposite side of panel 34 in a manner that selectively couples plate member 52 to panel 34.

When coupled with panel 34 in a first position, such as shown in FIG. 2, plate member 52 blocks a portion 60 of aperture 50 and thereby defines a second aperture 58 formed from a portion of the first aperture 50 which is adapted to allow the passage of wires (not shown) therethrough. When coupled with panel 34 in a second position as shown in FIG. 3, plate member 52 blocks a larger portion 60' of aperture 50 and thereby defines a second aperture 58' formed from a portion of the first aperture 50, adapted to allow the passage of wires (not shown) therethrough, which is of a smaller area than the second aperture 58 of FIG. 2. Accordingly, it is to be appreciated that the example wireway assembly 12 illustrated in FIGS. 2 and 3 provides a relatively large initial aperture 50 through which a wire bundle or gasket/wire bundle assembly (discussed further below) may be passed, as well as a selection of two smaller sized apertures 58 and 58' which may be selectively utilized based on the quantity of wires needed to be accommodated in a particular application.

Figure 4:
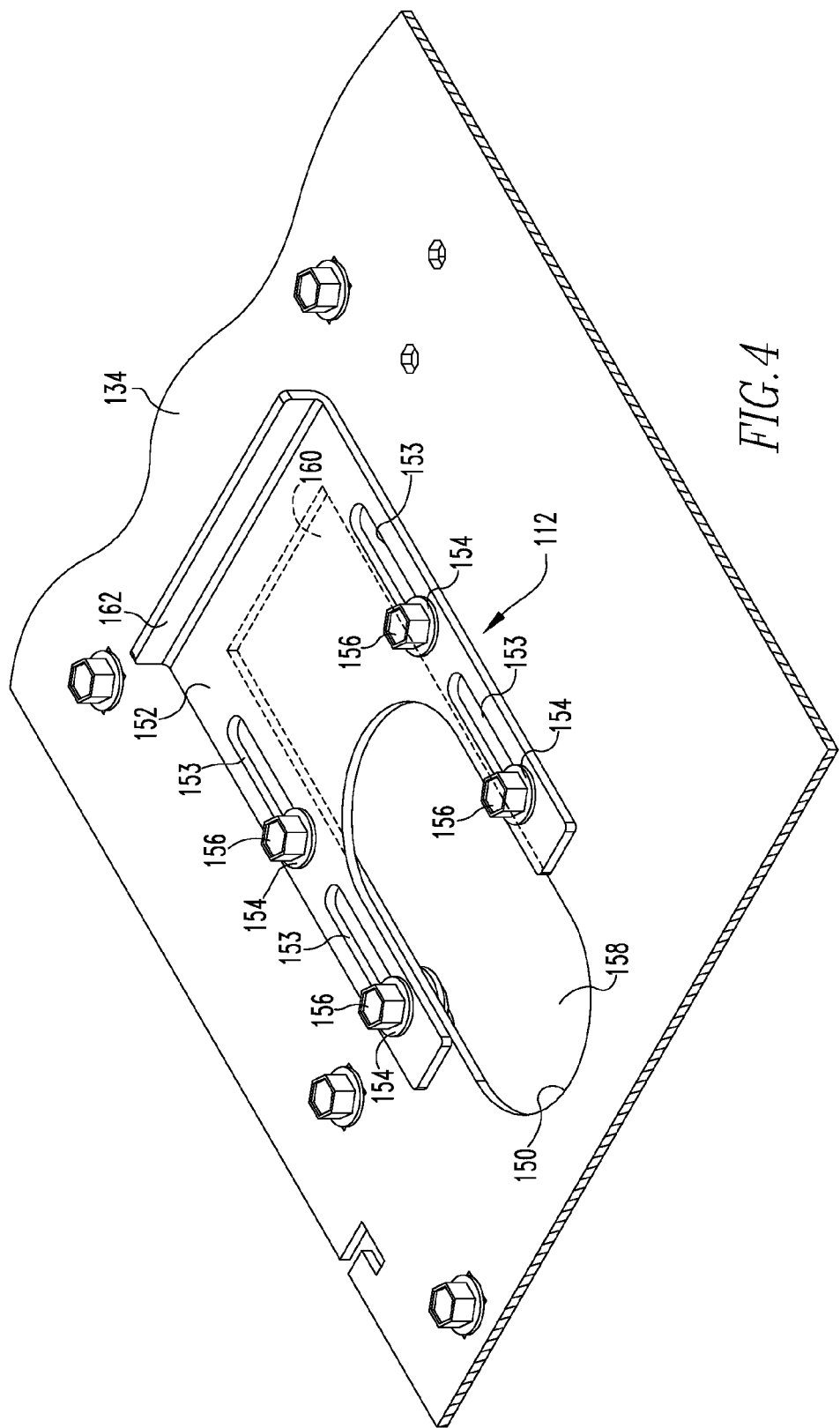
FIGS. 4 and 5 are isometric views of a portion of an electrical enclosure including a wireway assembly in accordance with another example embodiment of the disclosed concept disposed, respectively, in a first position and a second position with respect to the portion of the electrical enclosure.
Figure 5:
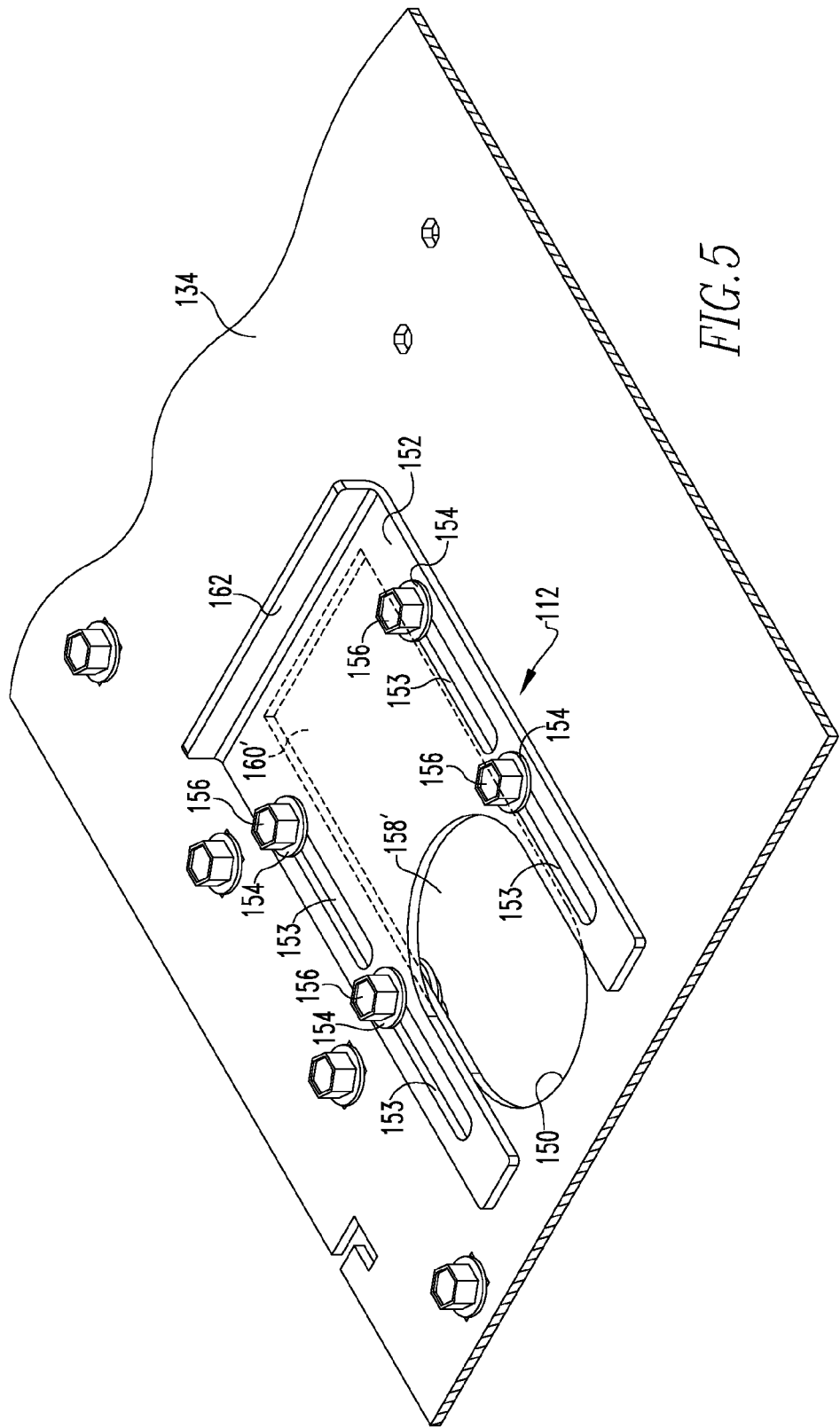

While FIGS. 2 and 3 illustrate an example of an embodiment of the present concept which provides a fixed number of predetermined sizes of apertures, FIGS. 4 and 5 as well as 6 and 7 illustrate example embodiments of the present concept which provide an aperture whose size may be adjusted anywhere within a particular range of sizes.

Referring to FIG. 4, similar to wireway assembly 12 previously discussed in regard to FIGS. 2 and 3, wireway assembly 112 includes an aperture 150 formed in a panel 134 (e.g., without limitation, any of portions 18, 20, 22, 24, 34, 36 of the enclosure of FIG. 1) of an electrical enclosure, and an adjustable member, such as plate member 152 selectively coupled to panel 134 about a portion of aperture 150 via a suitable number of fasteners. Such coupling is accomplished via the interaction of a number of slots 153 (four are shown in the embodiment of FIGS. 4 and 5) provided in plate member 152; bolts 156 which pass through washers 154 and slots 153 and threadingly engage a threaded member (e.g., without limitation, nuts, threaded apertures) provided in or on the opposite side of panel 134 in a manner that selectively couples plate member 152 to panel 134.

When coupled with panel 134 in a first position, such as shown in FIG. 4, plate member 152 blocks a portion 160 of aperture 150 and thereby defines a second aperture 158 formed from a portion of the first aperture 150 which is adapted to allow the passage of wires (not shown) therethrough. When slid along and coupled with panel 134 in a second position as shown in FIG. 5, plate member 152 blocks a larger portion 160' of aperture 150 and thereby defines a second aperture 158' formed from a portion of the first aperture 150, adapted to allow the passage of wires (not shown) therethrough, which is of a smaller area than the second aperture 158 of FIG. 4. Accordingly, it is to be appreciated that the example wireway assembly 112 illustrated in FIGS. 4 and 5 provides a relatively large aperture 150 through which a wire bundle or gasket/wire bundle assembly (discussed further below) may be passed, as well as a continuous range of various sized apertures (of the same size, or between those of second apertures 158 and 158') which may be selectively utilized based on the quantity of wires needed to be accommodated in a particular application.

Plate member 152 may further include one or more elements to assist in adjusting the relative of position of plate member 152 with respect to panel 134. In the example embodiment illustrated in FIGS. 4 and 5, plate member 152 further includes a tab member 162 which extends from plate member 152 in a direction generally away from panel 134 such that tab member 162 may be gripped by fingertips and/or a suitable gripping tool (e.g., without limitation, pliers). In the example embodiment illustrated in FIGS. 4 and 5, tab member 162 is integrally formed as an integral portion of a unitary plate member 152, it is to be appreciated however that tab member 162 may be formed from a separate material which is then coupled to plate member 152. It is also to be appreciated that one or more of the position, shape, or sizing of tab member 162 may be varied without varying from the scope of the disclosed concept.

Figure 6:
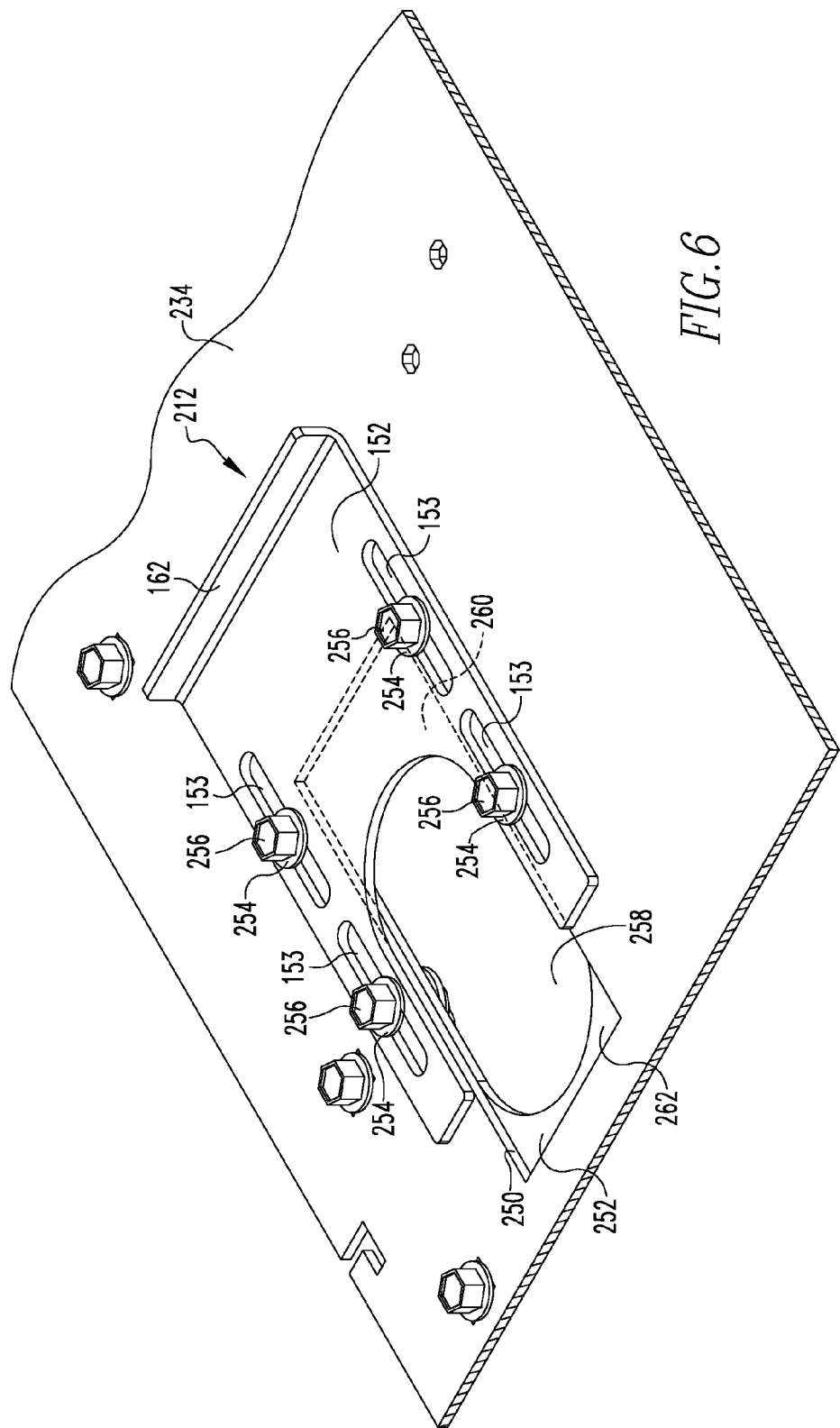
FIGS. 6 and 7 are isometric views of a portion of an electrical enclosure including a wireway assembly in accordance with yet another example embodiment of the disclosed concept disposed, respectively, in a first position and a second position with respect to the portion of the electrical enclosure.
Figure 7:
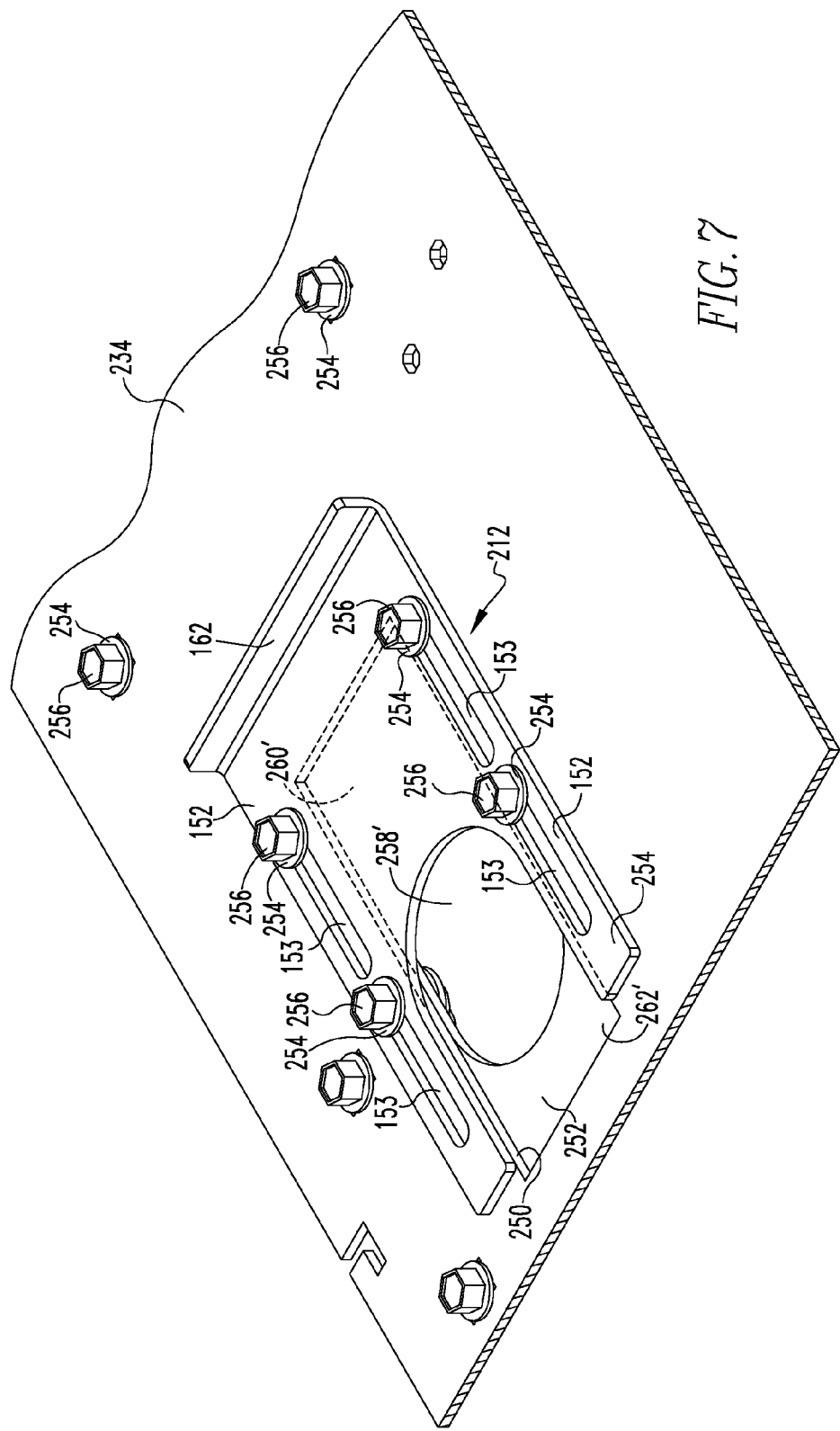

While FIGS. 4 and 5 illustrate an example of an embodiment of the present concept which provides an aperture whose size may be adjusted via movement of a single element anywhere within a particular range of sizes, the example embodiment of FIGS. 6 and 7 provides a somewhat similar arrangement that can be adjusted through an even larger range of sizes through the use of multiple adjustable elements.

Referring to FIG. 6, similar to wireway assembly 112 previously discussed in regard to FIGS. 4 and 5, wireway assembly 212 includes an aperture 250 formed in a panel 234 (e.g., without limitation, any of portions 18, 20, 22, 24, 34, 36 of the enclosure of FIG. 1) of an electrical enclosure, and a first adjustable member, such as first plate member 152 (previously described in conjunction with FIGS. 4 and 5) selectively coupled to a first side (not numbered) of panel 234 about a portion of aperture 250 via a suitable number of fasteners. Such coupling is accomplished via the interaction of a number of slots 153 (four are shown in the embodiment of FIGS. 6 and 7) provided in plate member 152; bolts 256 which pass through washers 254 and slots 153 and threadingly engage a threaded member (e.g., without limitation, nuts, threaded apertures) provided in or on the opposite side of panel 234 in a manner that selectively couples plate member 152 to panel 234.

Continuing to refer to FIG. 6, wireway assembly 212 further includes a second adjustable plate member 252 selectively coupled to a second side (not numbered) of panel 234 about another portion of aperture 250 so as to be moveable generally toward or away from plate member 152. Second adjustable member 252 may be of similar construction to that of either of plate members 52 or 152 (previously discussed) selectively coupled to panel 234 in the same or similar manner as previously discussed herein.

When coupled with panel 234 in a first position, such as shown in FIG. 6, plate member 152 blocks a portion 260 of aperture 250 and second adjustable member 252 blocks another portion 262 of aperture 250. The interaction of members 152 and 252 thereby defines a second aperture 258 formed from portions (not numbered) of each of members 152 and 252 which is adapted to allow the passage of wires (not shown) therethrough. When either or both of members 152 and 252 are slid along and coupled with panel 234 in respective second positions, such as shown in FIG. 7, plate member 152 blocks a larger portion 260' of aperture 250 and adjustable member 252 likewise blocks a larger portion 262' of aperture 250. Such arrangement thereby defines a second aperture 258' formed from portions (not numbered) of each of members 152 and 252 which is adapted to allow the passage of wires (not shown) therethrough. Such second aperture 258' is of a smaller area than the second aperture 258 of FIG. 6. Accordingly, it is to be appreciated that the example wireway assembly 212 illustrated in FIGS. 6 and 7 provides a relatively large aperture 250 through which a wire bundle or gasket/wire bundle assembly (discussed further below) may be passed, as well as a continuous range of various sized apertures (of the same size, or between those of second apertures 258 and 258') which may be selectively utilized based on the quantity of wires needed to be accommodated in a particular application by adjusting the position of one or both of members 152 and/or 252.

Figure 8:
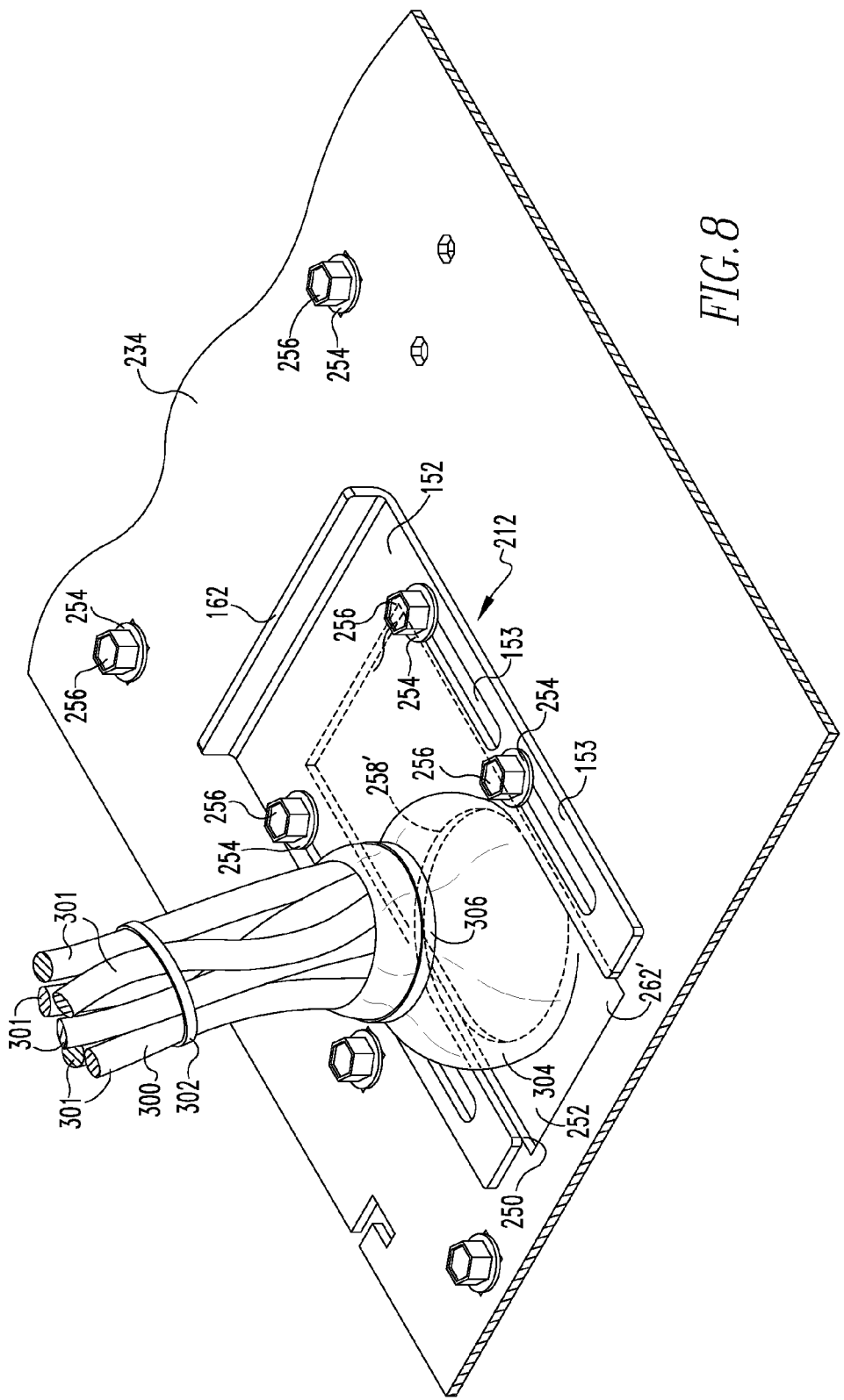
FIG. 8 is an isometric view of the wireway assembly of FIGS. 6 and 7 employed in a method in accordance with an example embodiment of the disclosed concept.

Having thus described example embodiments of the disclosed concept, an example embodiment of the disclosed concept in use will now be described in conjunction with FIG. 8 which illustrates the wireway assembly 212 of FIGS. 6 and 7 with a bundle 300 of wires 301 passing therethrough. Such arrangement includes a gasket material 304 disposed around the bundle 300 such that it seals between the bundle 300 and the aperture 258' defined by members 152 and 252. In the example embodiment illustrated in FIG. 8, gasket material 306 is secured to the bundle 300 on both sides of panel 234 via a wire tie 306 (only one side of the arrangement, and thus only one wire tie 306 is shown in FIG. 8) or other suitable mechanism to generally clamp the gasket material 306 with the bundle 300. Additionally, a suitable mechanism, such as wire tie 302, may be employed to generally couple the wires 301 together to form bundle 300. In an example embodiment of the disclosed concept, a gasket material formed from a closed cell neoprene (e.g., without limitation, ASTM D-1056-67: SCE41B, ASTM D-1056-00: 2A1, ASTM D 6576: II-A/B/C SOFT, UL LISTED) wrapped one and a half times (to ensure overlap) about bundle 300 was found to provide a suitable seal to achieve an arc resistant type "2B" rating for arc resistant switchgear (IEEE C37.20.7 Specification). It is to be appreciated that such gasket material and arrangement is provided for example purposes only and that other suitable arrangements of gasketing material and placement may be provided without varying from the scope of the disclosed concept.

It is to be appreciated that the arrangement illustrated in FIG. 8 may be assembled in a number of ways without varying from the scope of the disclosed concept. In general, the opening through panel 234 is first enlarged by loosening or removing one or both of members 152/252 from panel 234 to create a generally large initial opening through the panel 234 (e.g., without limitation, aperture 258 of FIG. 6). Next, the wires 301 (either individually, in groups, or as bundle 300) are passed through the large initial opening. Next, the gasket material 304 is placed around and secured to the bundle 300 (e.g., via wire ties 306) such that the gasket material is disposed (preferably generally centered—top to bottom) in the initial opening. Once the gasket material is disposed in the desired position, one or both of members 152 and 252 are then adjusted to snugly engage the gasket material 304 which generally results in gasket material 304 slightly overlapping the final aperture 258' defined by the members 152 and 252. Members 152 and 252 are then securely coupled to panel 234, thus producing the completed wireway arrangement shown in FIG. 8.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to scope of the disclosed concept which is to be given the full breadth of the claims appended and any and all equivalents thereof.

What is claimed is:

1. An adjustable wireway assembly comprising:
    a panel structured to form a portion of an electrical enclosure, the panel having a first aperture defined therein; and
    a plate member selectively coupled to the panel about a portion of the first aperture in at least one of a first position and a second position in a manner that blocks at least a portion of the first aperture and thereby defines a second aperture formed from a portion of the first aperture,
    wherein when coupled in the first position the second aperture is of a first area and when coupled in the second position the second aperture is of a second area different than the first area.

2. The wireway assembly of claim 1 wherein the plate member includes a number of apertures formed therein; and wherein when the plate member is disposed in either of the first or second positions the plate member is coupled to the panel via a number of threaded fasteners, each protruding through a respective one of the apertures.

3. The wireway assembly of claim 2 wherein each aperture of the number of apertures formed in the plate member is formed as a slot and wherein the plate member is slidable among a number of positions between the first position and the second position.

4. The wireway assembly of claim 3 wherein the plate member is selectively coupled to the panel in any of the number of positions between the first position and the second position.

5. The wireway assembly of claim 1 wherein the plate member is a first plate member; wherein the wireway assembly comprises a second plate member selectively coupled to the panel about another portion of the first aperture on a side opposite the first plate member, the second plate member being selectively coupled to the panel so as to be moveable generally toward or way from the first plate member in at least one of a first position and a second position in a manner that blocks another portion of the first aperture and thereby, along with the first plate member, defines a third aperture formed from a portion of the first aperture, wherein when the second plate member is coupled in the first position the third aperture is of a first area and when coupled in the second position the third aperture is of a second area different than the first area.

6. The wireway assembly of claim 5 wherein the second plate member includes a number of apertures formed therein; and wherein when the second plate member is disposed in either of the first or second positions the second plate member is coupled to the panel via a number of threaded fasteners, each protruding through a respective one of the apertures.

7. The wireway assembly of claim 6 wherein each aperture of the number of apertures formed in the second plate member is formed as a slot and wherein the second plate member is slidable among a number of positions between the first position and the second position.

8. The wireway assembly of claim 7 wherein the second plate member is selectively coupled to the panel in any of the number of positions between the first position and the second position.

9. An electrical enclosure comprising:
    a housing formed from a number of panels; and
    an adjustable wireway as recited in claim 1.

10. The electrical enclosure of claim 9 wherein the plate member includes a number of apertures formed therein; and wherein when the plate member is disposed in either of the first or second positions the plate member is coupled to the panel via a number of threaded fasteners, each protruding through a respective one of the apertures.

11. The electrical enclosure of claim 10 wherein each aperture of the number of apertures formed in the plate member is formed as a slot and wherein the plate member is slidable among a number of positions between the first position and the second position.

12. The electrical enclosure of claim 11 wherein the plate member is selectively coupled to the panel in any of the number of positions between the first position and the second position.

13. The electrical enclosure of claim 9 wherein the plate member is a first plate member; wherein the wireway assembly comprises a second plate member selectively coupled to the panel about another portion of the first aperture on a side opposite the first plate member, the second plate member being selectively coupled to the panel so as to be moveable generally toward or way from the first plate member in at least one of a first position and a second position in a manner that blocks another portion of the first aperture and thereby, along with the first plate member, defines a third aperture formed from a portion of the first aperture, wherein when the second plate member is coupled in the first position the third aperture is of a first area and when coupled in the second position the third aperture is of a second area different than the first area.

14. The electrical enclosure of claim 13 wherein the second plate member includes a number of apertures formed therein; and wherein when the second plate member is disposed in either of the first or second positions the second plate member is coupled to the panel via a number of threaded fasteners, each protruding through a respective one of the apertures.

15. The electrical enclosure of claim 14 wherein each aperture of the number of apertures formed in the second plate member is formed as a slot and wherein the second plate member is slidable among a number of positions between the first position and the second position.

16. The electrical enclosure of claim 15 wherein the second plate member is selectively coupled to the panel in any of the number of positions between the first position and the second position.

17. A method of assembling a sealed wireway assembly in an electrical enclosure having an adjustable wireway assembly as recited in claim 9, the method comprising:
   passing a number of wires through the first aperture formed in the panel;
   generally centering a gasket material disposed about the number of wires in the first aperture; and
   adjusting the position, with respect to the panel, of the plate member disposed about the first aperture such that a snug fit is produced between at least a portion of the plate member and the gasket material and between at least a portion of the first aperture and the gasket material.

18. The method of claim 17 wherein adjusting the position, with respect to the panel, of the plate member comprises sliding the plate member with respect to the panel and coupling the plate member to the panel.

19. The method of claim 17 wherein the plate member comprises a first plate member and wherein the method further comprises:
   adjusting the position, with respect to the panel, of a second plate member disposed about the first aperture such that a snug fit is produced between at least a portion of the second plate member and the gasket material and between at least a portion of the first plate member and the gasket material.

20. The method of claim 19 wherein adjusting the position, with respect to the panel, of the second plate member comprises sliding the second plate member with respect to the panel and coupling the second plate member to the panel.

* * * * *